(12) United States Patent
Ha et al.

(10) Patent No.: US 7,436,048 B2
(45) Date of Patent: *Oct. 14, 2008

(54) MULTICHIP LEADFRAME PACKAGE

(75) Inventors: Jongwoo Ha, Seoul (KR); Taebok Jung, Seoul (KR)

(73) Assignee: Chippac, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/686,010

(22) Filed: Mar. 14, 2007

(65) Prior Publication Data

US 2007/0152308 A1 Jul. 5, 2007

Related U.S. Application Data

(63) Continuation of application No. 11/252,193, filed on Oct. 17, 2005, now Pat. No. 7,208,821.

(60) Provisional application No. 60/619,847, filed on Oct. 18, 2004.

(51) Int. Cl.
   *H01L 23/495* (2006.01)
(52) U.S. Cl. ........................ 257/666; 257/676
(58) Field of Classification Search ................. 257/666, 257/676, 677, 777, 723, 724
   See application file for complete search history.

(56) References Cited

U.S. PATENT DOCUMENTS

| 6,707,151 B2 * | 3/2004 | Noguchi | 257/737 |
| 7,005,325 B2 * | 2/2006 | Chow et al. | 438/123 |
| 2002/0145180 A1 * | 10/2002 | Terui et al. | 257/666 |
| 2003/0001252 A1 * | 1/2003 | Ku et al. | 257/686 |
| 2003/0042591 A1 * | 3/2003 | Goller et al. | 257/686 |
| 2003/0214023 A1 * | 11/2003 | Uchida | 257/686 |

* cited by examiner

*Primary Examiner*—S. V Clark

(57) ABSTRACT

A multichip package has a leadframe including peripheral leads arranged about a centrally situated die paddle. A first die is attached to a first side of the leadframe die paddle. The second side of the leadframe is partially cut away so that an outer part of the die paddle is thinner, and an inner part of the leads is thinner. These partially cutaway portions in the second side of the leadframe provide a cavity, in which a second die is attached active side upward. The lower die may have bond pads near the center of the active surface, and electrical interconnection of the lower die may be made by wire bonds running through the gap between the die paddle and the leads; or, the lower die may be attached, and electrically interconnected, by flip chip interconnect to the die attach side of the cavity in the leadframe.

22 Claims, 4 Drawing Sheets

MULTICHIP LEADFRAME PACKAGE

CROSS-REFERENCE TO RELATED APPLICATIONS

This application is a Continuation of U.S. application Ser. No. 11/252,193, filed Oct. 17, 2005, now U.S. Pat. No. 7,208,821, which claims priority from U.S. Provisional Application Ser. No. 60/619,847, filed Oct. 18, 2004.

BACKGROUND

This invention relates to semiconductor chip packaging and, particularly, to leadframe packages having two or more semiconductor die attached to a leadframe.

A conventional leadframe consists of a generally planar metal piece, having peripheral leads arranged about a centrally situated die paddle. In a conventional leadframe package, a die is affixed to the die paddle by attaching the back side of the die to the die paddle using an adhesive, and electrically connecting the die to the leads by wire bonding between wire bond pads on the die and wire bond sites on the leads. It is known to construct a leadframe package having two or more semiconductor die attached to a leadframe and interconnected by wire bonding.

For example, U.S. Pat. No. 6,265,763 describes various multi chip package configurations having a first (lower) die affixed to a leadframe die paddle, and a second (upper) die stacked upon the first die, both die being interconnected to the leadframe by wire bonding. In some configurations the first die has peripheral wire bond pads and the second die has a smaller footprint than the first, and the second die is accordingly stacked directly onto the upper (active) side of the first die. In other configurations the first die has peripheral wire bond pads and the footprint of the second die is too large to fit on the active side of the first die without interfering with the wire bond pads on the first die; in such configurations a spacer having a suitably small footprint is onto the active side of the first die, and the second die is affixed over the first die.

As U.S. Pat. No. 6,285,763 points out, stacking wire bonded die in such a fashion can be effective for die having peripheral wire bond pads, but is unsuitable for die having the bond pads situated near a center line of the die. U.S. Pat. No. 6,285,763 proposes a multi chip package having at least one peripheral pad die and at least one central pad die, in which the leadframe has a central die paddle and leads separated from the die paddle by a gap. A peripheral pad die is attached in a conventional fashion onto the die paddle on one side (the "top" side) of the leadframe, and a central pad die is attached partly on the die paddle and partly on the leads on the other side (the "bottom" side) of the leadframe, with the active side of the die toward the leadframe and the central pads situated in the part of the die spanning the gap. The conventionally attached top die is interconnected directly to the central pad bottom die by wire bonds running between peripheral bond pads on the top die and central bond pads on the bottom die; and both the conventionally attached top die and the bottom die are wire bonded to the leads. The completed wire bonded assembly is then encapsulated to enclose and protect all the die and the wire bonds.

The extent to which a wire bonded package can be made thin is limited by the fact that the encapsulant must fully cover the wire bond loops over the die. That is, the wire bond loop height imposes a thickness dimension (loop height plus encapsulant thickness over the loops) in addition to the thickness of the leadframe and the thickness of the die. In a drive toward thinner packages, efforts have been made to reduce the wire bond loop height.

SUMMARY

The invention provides leadframe packages in which two or more semiconductor die are attached to opposite sides a leadframe. The leadframe has peripheral leads arranged about a centrally situated die paddle. A first ("upper") die is attached to a first ("top") side of the leadframe die paddle, which can be generally flat. The second ("bottom") side of the leadframe is partially cut away (such as by partial etching), so that an outer part of the die paddle is thinner, and so that an inner part of the leads is thinner. These partially cutaway portions in the second ("bottom") side of the leadframe provide a cavity, in which a second ("lower") die is attached active side upward. The lower die may have bond pads situated near the center of the active surface, and electrical interconnection of the lower die may be made by wire bonds running through the gap between the die paddle and the leads; or, the lower die may be attached, and electrically interconnected, by flip chip interconnect to the die attach side of the cavity in the leadframe.

In one general aspect the invention features a leadframe having a first ("top") side and a second ("bottom") side, the leadframe including a centrally situated die paddle having a margin and an edge, and including peripherally arranged leads each comprising an inner bond finger portion and an outer land, there being a gap between the edge of the die paddle and the inner ends of the bond finger portions. A surface of the top side of the die paddle includes a first die attach region. A step is provided in the bottom side of at least a portion of the die paddle margin and a step is provided in the bottom side of at least a portion of bond finger portion of at least one lead, the steps together forming a cavity, spanning the gap, and the steps having generally coplanar lower die attach surfaces in a plane generally parallel to the surface of the bottom side of the leadframe. The cavity is dimensioned to accommodate the footprint of a second die, to be attached within the cavity at second die attach regions of the steps. The distance between the plane of a lower die attach surface and the leadframe bottom surface constitutes the cavity depth, which is at least as great as the thickness of the second die plus the thickness of second die attach means.

The leadframe may include two or more such cavities, each dimensioned to accommodate the footprint of an additional die, and each having a depth at least as great as the thickness of the second die plus the thickness of additional die attach means. Each of the additional die may have the same footprint and thickness as the second die, or may have a different footprint and/or thickness.

In some embodiments the die paddle is generally rectangular, having four generally straight edge portions. In some such embodiments the leads are arranged so that the bond fingers are in a row adjacent at least one of the straight edge portions, there being a gap between the straight edge portion of the die paddle and the inner ends of the bond finger portions. In such embodiments the die paddle step is formed in a margin at one of the straight edge portions and the lead step is formed in bond fingers in the adjacent row, so that the cavity spans the gap. Some such embodiments further include one or more additional cavities, each including a die paddle step in the margin of another of the straight edge portions of the die paddle and a lead step formed in the bond fingers of the adjacent row, and spanning the gap. In some embodiments where the die paddle is generally rectangular, two cavities may be formed in the margins of opposite straight edge portions; or, four cavities may be formed, one in each of the four margins.

In another general aspect the invention features a semiconductor package having a leadframe as described above, and having a first upper die affixed to the first die attach region of the top side of the die paddle, and having a first lower die affixed to lower die attach regions in a cavity. In some such embodiments there are two or more, such as four, cavities, each having a lower die affixed to die attach regions in the cavities. In some such embodiments at least one additional upper die is stacked over and affixed onto the first die. An encapsulant covers the die and the respective wire bonds, and portions of the surfaces of the leadframe other than the die attach regions and, in some embodiments leaving the lower surface of the bottom side of the leadframe exposed, and in some embodiments leaving an area of the land portion of the leads exposed.

In some embodiments the first upper die is affixed active side upwards onto the top side of the die paddle, using a die attach epoxy or a film adhesive. Additional upper die can be affixed onto the first upper die, using a die attach epoxy or a film adhesive and, where necessary, using a spacer between stacked die to accommodate bond loops. The first upper die is interconnected to leads by wire bonds.

In some embodiments the lower die has bond pads situated near a center line of the active side, and the lower die is positioned so that the bond pads underlie the gap, and the lower die is affixed onto the lower die attach surfaces of the cavity, using a die epoxy or a film adhesive. The lower die is electrically interconnected by wire bonds passing through the gap, between the bond pads on the die and bond sites on the leads, and/or between the bond pads on the die and bond pads on an upper die.

In other embodiments the lower die is affixed onto the lower die attach surfaces in the cavity, and is electrically interconnected by, flip chip interconnection, employing solder balls or bumps, or gold bumps, for example, between die pads and interconnect sites on the steps in the cavity.

In another general aspect the invention features a multipackage module, including at least one package constructed as described above, the packages being electrically interconnected by solder balls of by wire bonds between the second-level interconnect sites on the respective leadframes.

BRIEF DESCRIPTION OF THE DRAWINGS

FIG. 2A is viewed from a first ("top") side of the leadframe, and FIG. 2C is viewed from a second ("bottom") side of the leadframe.

FIG. 4A is viewed from a first ("top") side of the leadframe, and FIG. 4C is viewed from a second ("bottom") side of the leadframe.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1A:
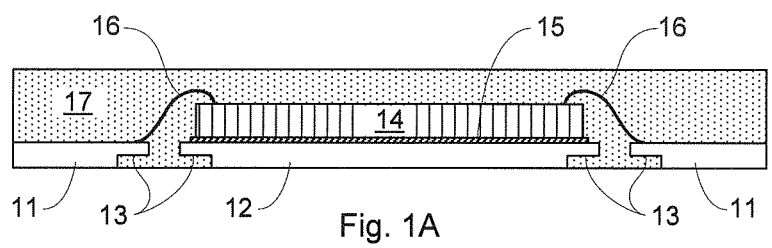
FIGS. 1A-1C are diagrammatic sketches in sectional view showing conventional semiconductor leadframe packages.

Turning now to FIG. 1A, there is shown a conventional leadframe package having a leadframe including a die paddle 12 and leads 11, arranged so that there is a gap between the edges of the paddle and the leads. A first die 14 is mounted onto a first ("top") surface of the die paddle 12, and affixed using a die attach adhesive 15. Die 14 is electrically interconnected with the leadframe by wire bonds 16 connecting bond pads on the die 14 with bond sites on the leads 11. The die and wire bonds and the areas of the top surface of the leadframe are protected by an encapsulant 17, which additionally fills the gap between the die paddle edges and the leads. The edges of the leads and die paddle are undercut, as shown at 13, to provide improved interlock between the leadframe edges and the encapsulant at the second ("bottom") side of the leadframe. Electrical interconnection of the package to circuitry in the particular application is made by connecting the bottom side of the leads with, for example a printed circuit board such as a motherboard (not shown in the FIG.) for example by solder balls (not shown).

Figure 1B:
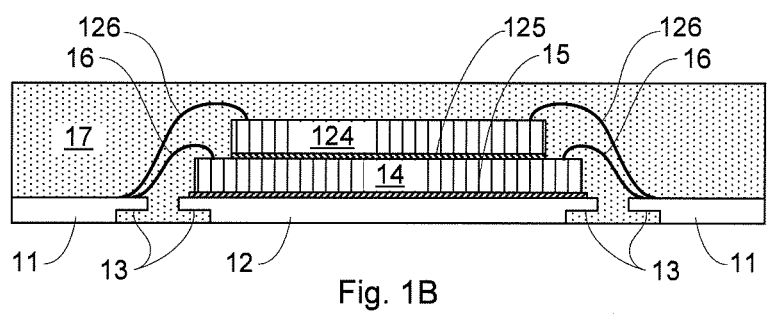

FIG. 1B shows a conventional leadframe generally as in FIG. 1A, having an additional die 124 mounted over the first die 14. The additional die 124 is affixed to the first die 14 using an adhesive 125, and it is electrically interconnected with the leadframe by wire bonds 126 connecting bond pads on the die 124 with bond sites on the leads 11. The package is encapsulated, 17, generally as for the embodiment in FIG. 1A. Such a stacked die configuration, having a footprint similar to a configuration as in FIG. 1A achieves at cost of additional thickness a higher density of semiconductor devices in the package.

Figure 1C:
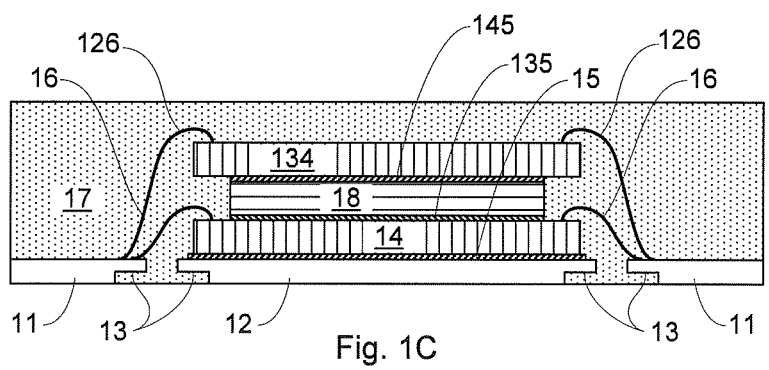

The additional die 124 in the embodiment of FIG. 1B has a narrower footprint than the first die 14, so that the additional die, which is mounted upon the first die, does not contact the bond pads on the first die. Where it is desired to stack a larger additional die over the first die, a spacer may be employed between the first die and the additional die, as shown for example in FIG. 1C. In this embodiment, the first die 14 is mounted onto the lead frame die paddle 12 and is affixed there using a die attach adhesive 15 generally as in FIGS. 1A and 1B. A spacer 18, which may be, for example, a silicon "dummy" die, is mounted onto the first die and is affixed using an adhesive 135. The second die 134 is mounted over the spacer 18 and is affixed there using an adhesive 145. The second die 134 is electrically interconnected by wire bonds 126 connecting bond pads on the second die 134 with bond sites on the leads 11. The first die 14 is electrically interconnected with the leadframe by wire bonds 16 connecting bond pads on the die 14 with bond sites on the leads 11. The thickness of the spacer 18 is made great enough to provide, together with the thicknesses of the adhesives 135 and 145, sufficient clearance between the first and the second die to avoid contact between the underside of the second die 124 and the wire loops of wire bonds 16. The package is encapsulated, 17, generally as for the embodiment in FIG. 1A.

Figure 1D:
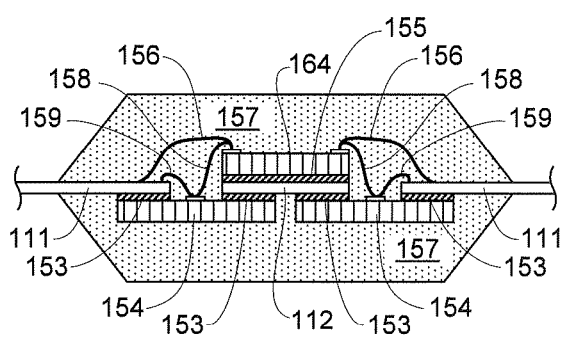
FIG. 1D is a diagrammatic sketch in sectional view showing a conventional semiconductor package having die mounted onto top and bottom sides of the leadframe.

FIG. 1D illustrates a multichip leaded package in which greater die density is achieved by mounting die on the bottom side as well as on the top side of the leadframe. The leadframe includes a die paddle 112 and leads 111, with a gap between the edges of the die paddle and the leads. A first ("top") die 164 is mounted onto the top side of the die paddle 112 and affixed using an adhesive 155. Second ("bottom") die 154, are "center pad" chips; that is, they are die in which the bond pads are arranged toward a center line of the active side of the die. Each second die 154 is mounted onto the bottom side of the leadframe and situated so that the bond pads on the die are within the gap; and each second die 154 is affixed, partly onto the bottom side of the die paddle, and partly onto the bottom side of the leads, using adhesive 153. The top die 164 is electrically interconnected by wire bonds 156 connecting bond pads on the top die 164 with bond sites on the leads 111; and the bottom die 154 is electrically interconnected by wire bonds 159 connecting bond pads on the bottom die 154 with bond sites on the leads 111, and optionally by wire bonds 158 connecting bond pads on the bottom die 154 with bond pads on the top die 164. The package is encapsulated, 157, to enclose the die and wire loops, leaving projecting portions of leads 111 for interconnection to the device (not shown in the FIGS.) in which the package is to be used.

Figure 1E:
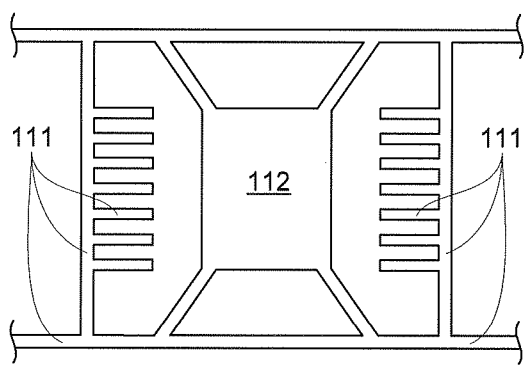
FIG. 1E is a diagrammatic sketch in a plan view showing a leadframe as in the package of FIG. 1D.

FIG. 1E shows a leadframe, as for the package in FIG. 1D, in a plan view. In the leadframe of FIG. 1E leads 111 are arranged in two rows, adjacent two opposite generally straight edges of the centrally situated die paddle 112, with a gap between the die paddle edges and the respective rows of leads.

Figure 2A:
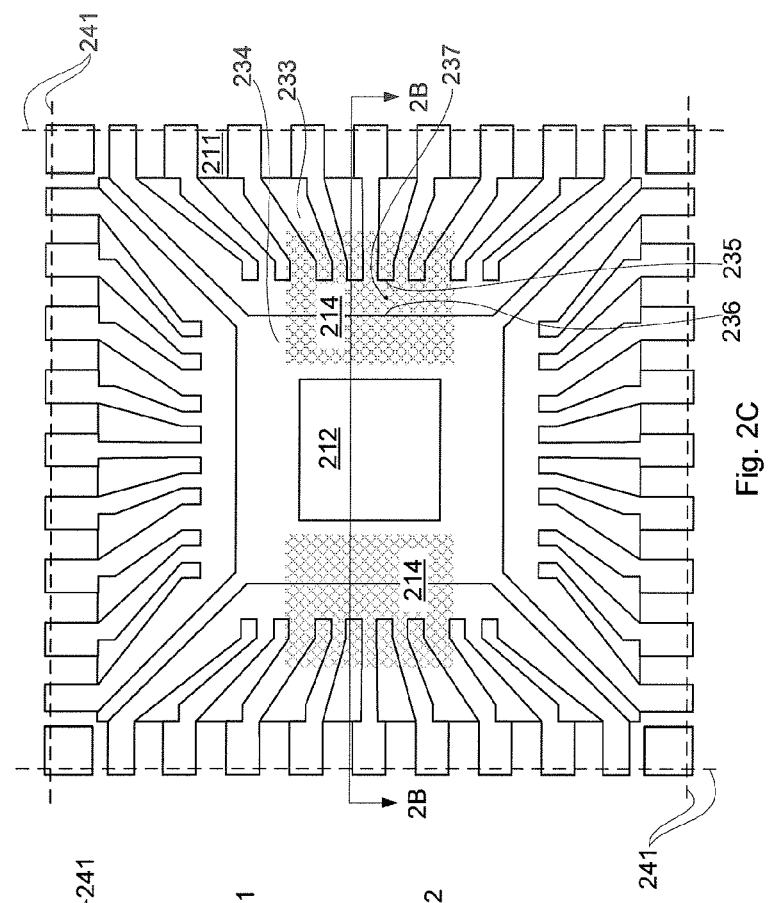
FIGS. 2A and 2C are diagrammatic sketches in a plan view showing a leadframe according to an embodiment of the invention.
Figure 2C:
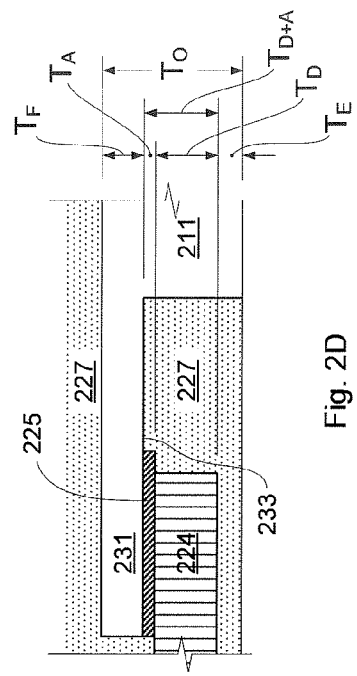
Figure 2B:
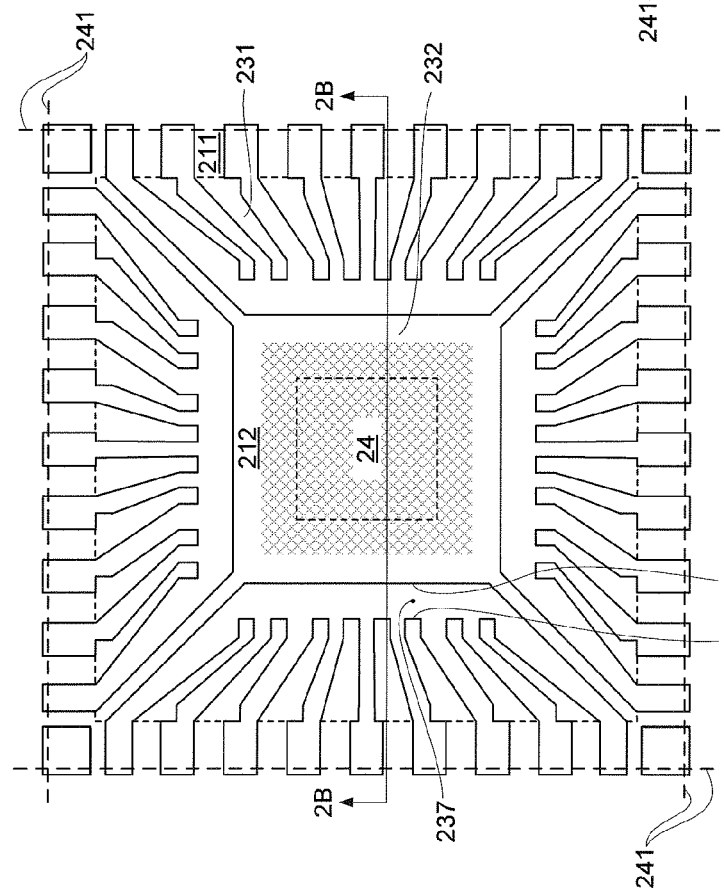
FIG. 2B is a diagrammatic sketch in a sectional view thru 2B-2B showing a multichip leadframe package according to an embodiment of the invention, having a leadframe as shown for example in FIGS. 2A and 2C.

FIGS. 2A-2C illustrate a multichip package according to one embodiment of the invention. FIGS. 2A and 2C show a leadframe according to this embodiment in a plan view, FIG. 2A showing the "top" side and FIG. 2C showing the "bottom" side; and FIG. 2B shows a package generally at 202, according to such an embodiment, in a sectional view thru 2B-2B of FIG. 2A or 2C. The leadframe includes centrally situated die paddle 212 and peripherally arranged leads. The die paddle 212 includes a margin 232, and the leads include inner bond finger portions 231 and land portions 211. A number of such leadframes are typically formed in an array on a sheet of metal, such as copper. The packages are formed on the array of leadframes, and then completed individual packages are separated (singulated) by sawing or punching. Broken lines 241 in FIGS. 2A and 2C indicate the singulation lines to form the edges of the completed package, as shown at 241 in FIG. 2B. A first ("top") die 24 is mounted on a die attach region of the surface of the top side of the die paddle 212, and is affixed using an adhesive 25. The top die footprint is indicated by crosshatched area 24 in FIG. 2A. The top die is electrically interconnected by wire bonds 26 connecting bond pads on the die with bond sites on the lead fingers 231. Cavities in the lead frame at the bottom side are provided by steps 233, 234 formed in the bond finger portions 231 of the leads and in the margin 232 of the die paddle 212. Bottom die 224 are mounted in the cavities and affixed using adhesive 225 to die attach regions on the steps 234, 233 in the bond finger portions 232, 231 of the die paddle margin and the leads, respectively. The bottom die 224 are center pad die; that is, the bond pads are situated toward a midline of the active side of the die. Each bottom die 224 is situated so that it spans the gap 237 between the edge 236 of the die paddle 212 and the ends 235 of the bond fingers 231, and so that the bond pads on the die are within the gap 237. The footprints of the bottom die are indicated by crosshatched areas 214 in FIG. 2C. The bottom die 224 is electrically interconnected by wire bonds 226 which pass through the gap 237 between bond pads on the die and bond sites on the bond fingers. An encapsulant 217 covers and protects the die and the wire bonds; in this embodiment a portion 251 of the surface of the bottom side of the land ends 211 of the leads, and a middle portion 252 of the surface of the bottom side of the die paddle 212, are not covered by encapsulant, but are left exposed. The encapsulation shown in FIG. 2B is molded (compare FIG. 3C). Electrical interconnection of the package with the circuitry of the apparatus (not shown in the FIG.) in which the package is used (second level interconnect) is made by way of contact with the exposed portions 251 of the land ends of the leads, for example by solder ball interconnection with a printed circuit board such as, for example, a motherboard. The exposed portion 252 of the die paddle can serve for heat conduction and dissipation away from the die and out of the package.

The leadframe according to the invention can be made from a sheet of a leadframe material, such as a copper sheet, by masking and etching. The steps can be formed, for example, by masking and etching partway through the sheet from the bottom side, and the shapes in plan view of the die paddle and leads are formed by masking and etching entirely through the sheet. The depth of the steps can be limited by controlling the etch, according to procedures well known in the leadframe art. The partial etch (as well as other etch processes) to form the steps will in practice not be expected to form surfaces precisely planar and parallel or perpendicular, as indicated diagrammatically in the FIGS. According to the invention the depth of the cavities, that is, the depth to which the steps are formed, must be sufficient to accommodate the thickness of the bottom die and die attach adhesive; and the width and length of the cavities must be sufficient to accommodate the footprint of the bottom die. The die attach surfaces of the cavities need be sufficiently flat to provide an adequate surface for mounting the die and for affixing the die using a die attach adhesive.

Figure 2D:
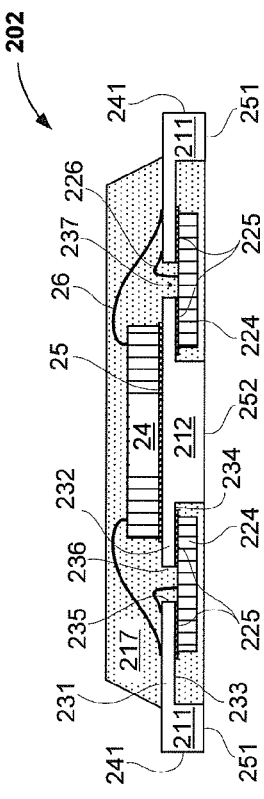
FIG. 2D is a diagrammatic sketch showing a segment of the leadframe package of FIG. 2B.

FIG. 2D shows a segment of FIG. 2B enlarged, and marked up to point out some thickness dimensions of a leadframe according to the invention. Particularly, a segment of the land portion 211 and the bond finger portion 231 of the leads is shown, together with a segment of a second die 224 mounted onto a step 233 formed in the leads, and affixed there using an adhesive 225, and a segment of the encapsulant 227. The thickness of the die 224 is $T_D$, and the thickness of the adhesive 225 is $T_A$. The depth of the step must be at least as great as the sum $T_{D+A}$ of the thicknesses of the die and the adhesive, and, typically, it is preferred that the encapsulant 227 cover the backside of the die with a layer of encapsulant having a thickness $T_E$. Accordingly, the depth of the step may preferably have a depth equal to $T_{D+A}$ plus $T_E$. The thickness of the stepped portion of the bond finger is $T_F$, and so the overall thickness $T_O$ of the leadframe must be at least $T_{D+A}$ plus $T_F$, and may preferably be $T_{D+A}$ plus $T_F$ plus $T_E$.

Accordingly, the depth required for the step in a particular embodiment according to the invention will depend upon the thickness of the selected bottom die and the thickness of the bottom die attach adhesive. Thicknesses of different die differ widely; bottom die for which the invention is suitable may be comparatively thin, and while the semiconductor wafer may be thinned by backgrinding, as practical matter the minimum die thickness may depend in part on the particular die type. Backgrinding to thicknesses less than about 100 micrometers is at present routine for at least some semiconductor types; and production of ever thinner die is likely as processing improves. Also, different die attach adhesives have different thicknesses for effective die attach. Generally, thin film adhesives can be thinner; however, if the die attach surface of the step is significantly nonplanar, a paste adhesive, such as a die attach paste epoxy, may be more suitable. A typical controller die, for example, may have a thickness about 80 micrometers or less, and the die attach adhesive may have a thickness about 20 micrometers, and in such an example the thickness $T_{D+A}$ would be about 100 micrometers or less. The bond finger thickness $T_F$ according to the invention is less than about 100 micrometers, and is usually less than about 75 micrometers, preferably about 50 micrometers or less.

The overall thickness $T_O$ of the leadframe according to the invention (that is, the thickness of the metal sheet starting material for the leadframe) may be greater than that of thinner conventional leadframes. For example, where the selected bottom die has a thickness about 80 micrometers and the die attach adhesive has a thickness about 20, the depth of the cavity must be at least about 100 (4 mil) and, where a bond finger thickness about 50 (2 mil) is desired, the overall thickness of the leadframe must be at least about 150 (6 mil). According to the invention, depending upon the thickness of the selected bottom die and die attach epoxy, and the specified thickness of the bond fingers, and depending upon whether the backside of the bottom die is to be exposed or is to be covered by a thin layer of encapsulant, the thickness of the leadframe may be as great as about 300 (12). Where the bottom die is to be covered by a thin layer of encapsulant, the thickness $T_E$ should be sufficiently great to permit flow of the encapsulant between the mold and the surface of the bottom die during encapsulation; the extent to which the thickness $T_E$ can be minimized will depend upon the flow characteristics of the encapsulant material and the area of the die surface, among other factors well known in the art. On the other hand, die as thin as 50 micrometers can at present be made.

By way of example, in power amplifier packages according to the invention, the top die may be a power amplifier, for example, and the bottom die may be power controllers, or may have some other function (or, the various bottom die may be of different types). It is desirable to have controller die in the same package as the power amplifier die, for several reasons, particularly because the controlling function can be made faster by shortening the interconnections of the controller with the power amplifier. Because a power amplifier typically generates a significant amount of heat, one advantage of such a configuration according to the invention is that the surface of the bottom side of the die paddle is exposed to ambient, and provides an effective means for heat dissipation away from the package—either by contact with a heat sink (such as by attachment to a printed circuit board such as a motherboard, for example) or by exposure to a stream of ventilating air.

A multichip package according to the invention is made by providing a leadframe having a die paddle and leads, and having cavities formed in the bottom side. The cavities are dimensioned to accommodate the thickness and footprint of selected lower die. The leadframe is placed on a support, and the lower die are mounted in their respective cavities and affixed using a die attach adhesive such as an adhesive film or paste epoxy. The adhesive may be cured, or partially cured, to secure the lower die in the cavities during subsequent processing. Or, the lower die are mounted by flip chip interconnect, by way of bumps or balls, which may be solder or gold bumps, for example. The leadframe is then inverted and placed on a support, and the first upper die is mounted onto the top surface of the die paddle and affixed using an adhesive, such as an adhesive film or a paste epoxy. The adhesive may be cured, or partially cured, and then, optionally, a second upper die is mounted upon the first upper die and affixed using an adhesive. Where a spacer is required between die in the stack, the spacer may be stacked upon the first die, and the second die may be stacked upon the spacer, both the spacer and the second die being affixed using an adhesive. Wire bond interconnects are made, using a wire bonding tool, in an appropriate sequence. It may be preferred, for example, to form wire bonds from the lower die following attachment of the first upper die, and to form wire bonds from the first upper die before attachment of a spaced second upper die. Once all the wire bonds have been formed, the die and the wires are encapsulated, using an encapsulation material or molding compound, which is then cured. The encapsulation may be molded, so that a marginal portion of the top of the land ends of the leads are left exposed, or not molded. Where, as is typical, an array of packages is made, the packages are then singulated by sawing or punching and, where the encapsulation is not molded, the saw or punch singulation cuts through the encapsulant as well as the leadframe. Other steps in the process will be inferred according to the art; for example, cleaning steps may be carried out at various points (particularly, preceding wire bonding procedures and preceding the encapsulation, for example).

Figure 3A:
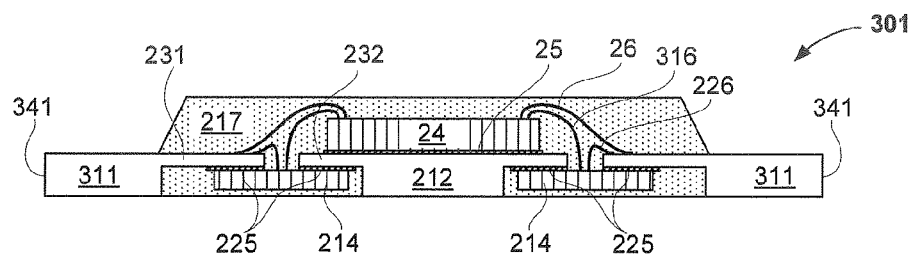
FIG. 3A is a diagrammatic sketch in sectional view showing a multichip leadframe package according to an aspect of the invention.

The embodiment shown by way of example 301 in sectional view in FIG. 3A is similar to that in FIG. 2B; in the embodiment of FIG. 3A, electrical interconnect of the bottom die 214 is additionally made to the top die 24 by wire bonds 316 passing through the gap between the die paddle edge and the bond fingers and connecting the die pads, respectively, on the bottom die and the top die. The land ends 311 of the leadframe in FIG. 3A are shown larger than in FIG. 2B, that is, the edges 341 of the land ends (formed by punch or saw singulation) project farther laterally from the encapsulant 217; the larger land ends provide for interconnect between one such package and a second package stacked above it, for example by solder balls, as shown for example in FIG. 3D, described below.

Figure 3B:
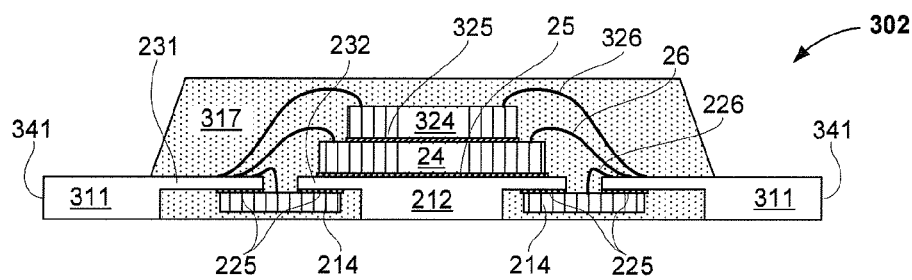
FIG. 3B is a diagrammatic sketch in sectional view showing a multichip leadframe package according to another aspect of the invention, having die stacked on the first ("top") side of the leadframe.

The embodiment shown by way of example 302 in sectional view in FIG. 3B is also similar to that in FIG. 2B; in the embodiment of FIG. 3B, an additional top die 324 is stacked over the first top die 24, and is affixed using adhesive 325. Electrical interconnection of the first top die 24 and of the additional top die 324 is made by wire bonds 26 connecting bond pads on the first top die 24 with bond sites on the bond fingers 231, and by wire bonds 326 connecting bond pads on the additional top die 324 with bond sites on the bond fingers 231. The land ends 311 of the leadframe in FIG. 3A is shown larger than in FIG. 2B, that is, the edges 341 of the land ends (formed by punch or saw singulation) project farther laterally from the encapsulant 217; the larger land ends provide for interconnect between one such package and a second package stacked above it, as shown for example in FIG. 3D, described below.

Figure 3C:
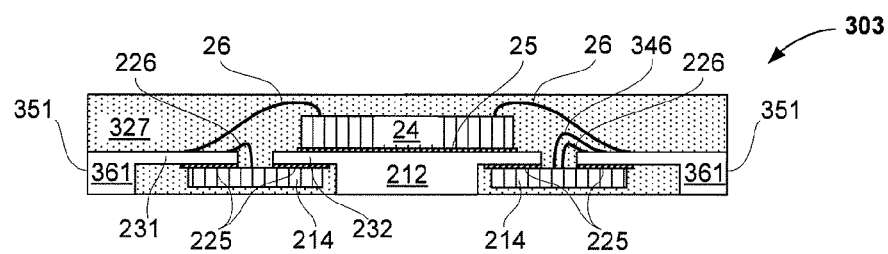
FIG. 3C is a diagrammatic sketch in sectional view showing a multichip leadframe package according to another aspect of the invention.

The embodiment shown by way of example 303 in sectional view in FIG. 3C is similar to that in FIG. 2B; in the embodiment of FIG. 3C, the encapsulated packages are singulated by punching or sawing through the encapsulant 327 and lead ends 361 of the leadframe. Also in this embodiment additional wire bond interconnections 346 are provided, passing through the gap to wire bond pads on the bottom die 24 with bond sites on the bond fingers 231.

Figure 3D:
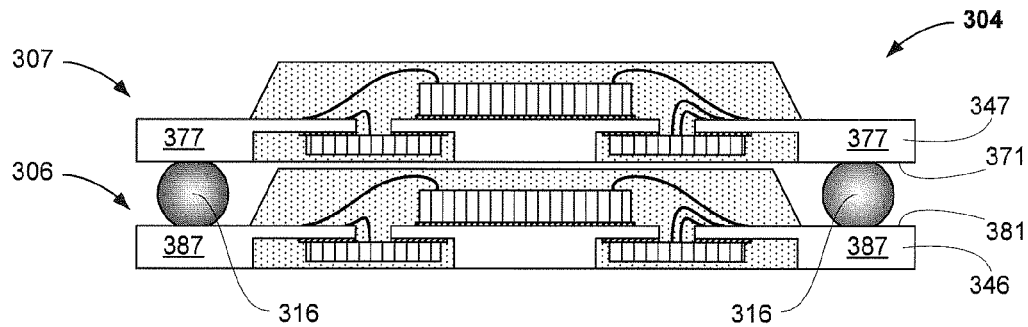
FIG. 3D is a diagrammatic sketch in a sectional view showing a multipackage module having stacked multichip leadframe packages according to the invention.

As noted above, any of the various packages according to the invention may be stacked with other packages (which may or may not be made according to the invention) to form multi-package modules. By way of example, FIG. 3D shows an embodiment of a multipackage module 304 having two packages 306, 307 according to the invention stacked one over the other and interconnected by solder balls 316 arranged between the top surface 381 of the land end 387 of the leadframe 346 of lower package 306, and the bottom surface 371 of the land end 377 of the leadframe 347 of upper package 307. A multipackage module according to the invention may have more than two stacked packages, at least one of which is a leadframe package according to the invention. The packages in such a multipackage module according to the invention need not be identical; as noted above, according to the invention at least one of the packages in such a multipackage is a leadframe package according to the invention.

Figure 3E:
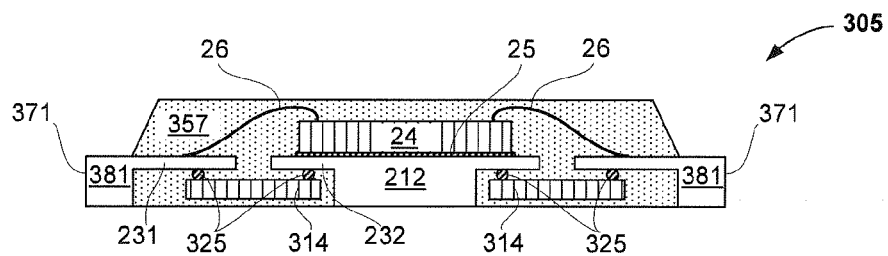
FIG. 3E is a diagrammatic sketch in sectional view showing a multichip leadframe package according to another aspect of the invention, having flip chip lower die.

FIG. 3E shows still another embodiment of the invention, generally at 305, in which each of the bottom packages 314 is mounted onto the die attach surface in the cavity by flip chip interconnection, that is by way of conductive balls or bumps 325, which may be gold bumps or solder bumps. The balls or bumps 325 serve to affix the bottom flip chip die 314 onto the die attach surface of the cavity and to provide electrical interconnection between the die and the die paddle margin and between the die and the bond fingers 231 of the various leads. The attachment of the bottom die 314 is strengthened by the encapsulant 357. As in the embodiment of FIG. 2B, for example, the edge 371 of the leadframe is defined by saw or punch singulation, and part of the surface of the land ends 381 of the leads is not covered by the encapsulant 357, but is left exposed for second level interconnection to apparatus (not shown) in which the package is to be used.

Figure 4C:
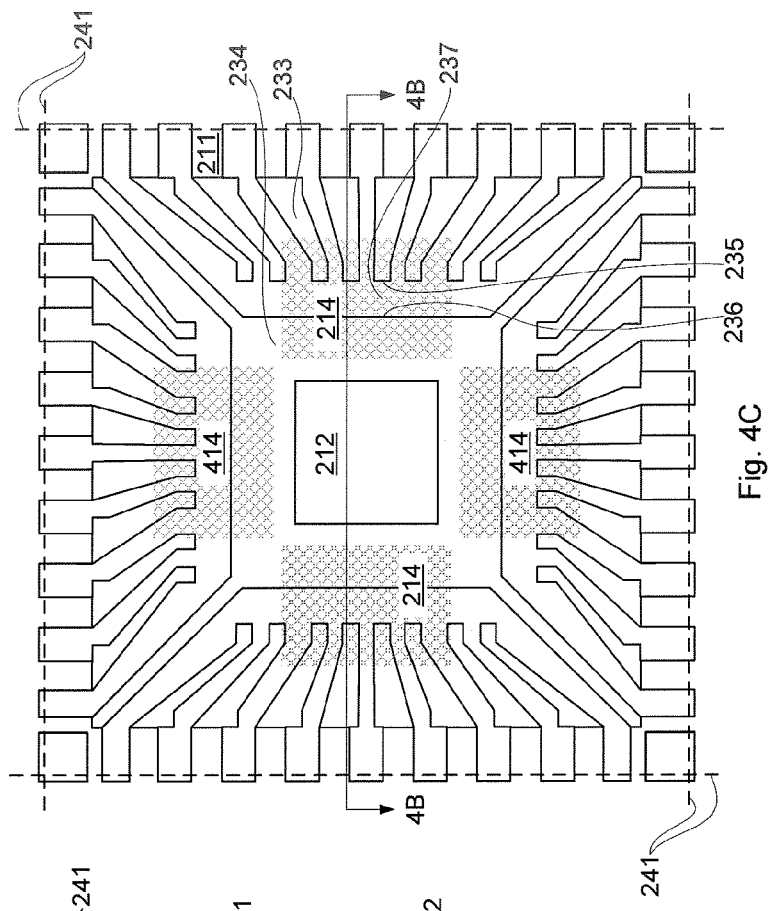
FIGS. 4A and 4C are diagrammatic sketches in a plan view showing a leadframe according to an embodiment of the invention.
Figure 4A:
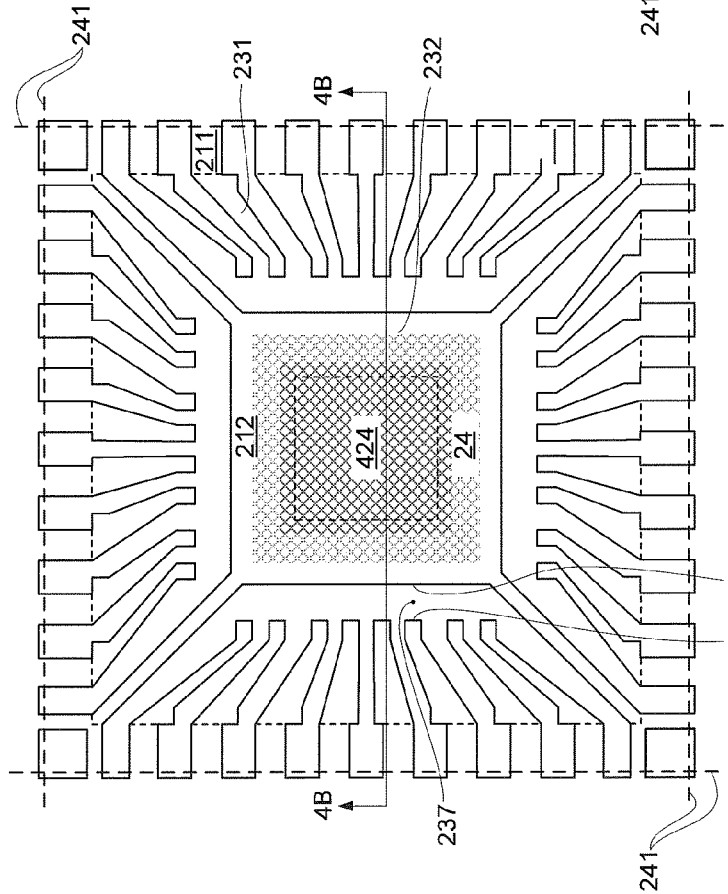
Figure 4B:
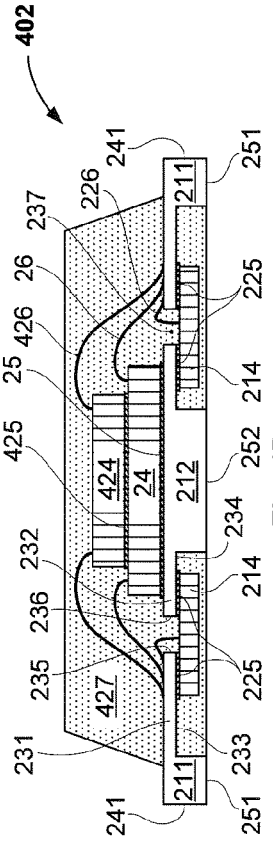
FIG. 4B is a diagrammatic sketch in a sectional view thru 4B-4B showing a multichip leadframe package according to an embodiment of the invention, having a leadframe as shown for example in FIGS. 4A and 4C.

As noted above with reference for example to FIG. 3B, according to the invention additional die may be stacked over the first die over the top side of the leadframe. Also according to the invention, additional die may be mounted in cavities in the bottom side of the leadframe. Both these options are illustrated in FIGS. 4A-4C, illustrating a multichip package according to another embodiment of the invention. FIGS. 4A and 4C show a leadframe according to this embodiment in a plan view, FIG. 4A showing the "top" side and FIG. 4C showing the "bottom" side; and FIG. 4B shows a package generally at 402, according to such an embodiment, in a sectional view thru 4B-4B of FIGS. 4A or 4C. Here, as in the embodiment of FIGS. 2A-2C, the leadframe includes centrally situated die paddle 212 and peripherally arranged leads. The die paddle 212 includes a margin 232, and the leads include inner bond finger portions 231 and land portions 211.

A number of such leadframes are typically formed in an array on a sheet of metal, such as copper. The packages are formed on the array of leadframes, and then completed individual packages are separated (singulated) by sawing or punching. Broken lines 241 in FIGS. 4A and 4C indicate the singulation lines to form the edges of the completed package, as shown at 241 in FIG. 4B. A first "upper" die 24 is mounted on a die attach region of the surface of the top side of the die paddle 212, and is affixed using an adhesive 25. The first upper die footprint is indicated by crosshatched area 24 in FIG. 2A. A second upper die 424 is mounted over the first top die 24, and is affixed using an adhesive 425. The first upper die 24 is electrically interconnected by wire bonds 26 connecting bond pads on the die with bond sites on the lead fingers 231, and the second upper die 424 is electrically interconnected by wire bonds 426 connecting bond pads on the die with bond sites on the lead fingers 231.

Also here, as in the embodiment of FIG. 2A-2C, cavities in the lead frame at the bottom side are provided by steps 233, 234 formed in the bond finger portions 231 of the leads and in the margin 232 of the die paddle 212. Bottom die 214 and additional bottom die 424 are mounted in the cavities and affixed using adhesive 225 to die attach regions on the steps 234, 233 in the bond finger portions 232, 231 of the die paddle margin and the leads, respectively. The bottom die 214 and 424 are center pad die; that is, the bond pads are situated toward a midline of the active side of the die. Each bottom die 214, 424 is situated so that it spans the gap 237 between the edge 236 of the die paddle 212 and the ends 235 of the bond fingers 231, and so that the bond pads on the die are within the gap 237. The footprints of the bottom die are indicated by crosshatched areas 214 and 414 in FIG. 4C. The bottom die 214 and 424 are electrically interconnected by wire bonds 226 which pass through the gap 237 between bond pads on the die and bond sites on the bond fingers. An encapsulant 427 covers and protects the die and the wire bonds; in this embodiment a portion 251 of the surface of the bottom side of the land ends 211 of the leads, and a middle portion 252 of the surface of the bottom side of the die paddle 212, are not covered by encapsulant, but are left exposed. The encapsulation shown in FIG. 4B is molded (compare FIG. 3C). Electrical interconnection of the package with the circuitry of the apparatus (not shown in the FIG.) in which the package is used (second level interconnect) is made by way of contact with the exposed portions 251 of the land ends of the leads, for example by solder ball interconnection with a printed circuit board such as, for example, a motherboard. The exposed portion 252 of the die paddle can serve for heat conduction and dissipation away from the die and out of the package.

In the embodiments of FIGS. 2A and 2C, and FIGS. 4A and 4C, the cavities are contiguous and, in each of these embodiments, the respective bottom die may be said to be mounted in different regions of the same continuous die cavity. That is, the step in the die paddle extends continuously all around the margin of the die paddle; and the opposite step (across the gap) is formed in all the lead fingers. Other variations are possible; each cavity need be large enough to accommodate the footprint (length and width) of the selected die that is to be mounted in it. In an embodiment as in FIGS. 2A, 2C, for instance, having two bottom die arranged over the gap along opposite edges of the paddle, the steps in the paddle margin and in the leads need not be extended to the other two edges, nor into the corners of the leadframe.

All patents and patent publications referred to herein are incorporated by reference.

Other embodiments are within the scope of the invention.

What is claimed is:

1. A leadframe, having a first side and a second side, the leadframe comprising a die paddle and leads, each lead comprising an outer land portion and an inner bond finger portion, the die paddle having a margin and an edge, there being a gap between the die paddle edge and inner ends of the bond finger portions of the leads, a surface of the first side of the die paddle including a first side die attach region, and further comprising at least one cavity in the second side of the leadframe, each cavity having a depth and at least one die mount surface spanning the gap, the die mount surface being dimensioned to accommodate the footprint of a selected second side die, and the depth being dimensioned at least as great as the thickness of the selected second side die plus the thickness of selected second side die mounting means and a bottom die mounted in the at least one cavity.

2. The leadframe of claim 1, comprising at least two said cavities in the second side of the leadframe.

3. The leadframe of claim 1, comprising four said cavities in the second side of the leadframe.

4. The leadframe of claim 1, comprising at least two said die mount surfaces spanning the gap.

5. The leadframe of claim 1, comprising four said die mount surfaces spanning the gap.

6. A leadframe, having a first side and a second side, the leadframe comprising a die paddle and leads, each lead comprising an outer land portion and an inner bond finger portion, the die paddle having a margin and an edge, there being a gap between the die paddle edge and inner ends of the bond finger portions of the leads, a surface of the first side of the die paddle including a first side die attach region, and further comprising at least one cavity in the second side of the leadframe, each cavity spanning the gap and comprising a step in a portion of the second side of the die paddle margin and a step in a portion of the second side of the bond finger portion of at least one lead, the steps comprising a die mount surface of the cavity comprising a die attach surface being dimensioned to accommodate the footprint of a selected second side die, and the depth being dimensioned at least as great as the thickness of the selected second side die plus the thickness of selected second side die mounting means and a bottom die mounted in the at least one cavity.

7. A leadframe, having a first side and a second side, the leadframe comprising a die paddle and leads, each lead comprising an outer land portion and an inner bond finger portion, the die paddle having a margin and an edge, there being a gap between the die paddle edge and inner ends of the bond finger portions of the leads, a surface of the first side of the die paddle including a first side die attach region, and further comprising a step in a portion of the second side of the die paddle margin and a step in a portion of the second side of the bond finger portion of at least one lead, the steps in the second side of at least a portion of the die paddle margin together with a step in the second side of at least a portion of bond finger portion of at least one lead form a cavity spanning the gap, the steps having generally coplanar second die attach surfaces in a plane generally parallel to a surface of the second side of the leadframe, the cavity being dimensioned to accommodate the footprint of a second die, the cavity having a depth at least as great as the thickness of the second die plus the thickness of second die attach means and a bottom die in the cavity.

8. A multichip leadframe semiconductor package, comprising the leadframe of claim 1, a first die affixed to said first side die attach region, and a second die affixed to a die mount surface of a said cavity.

9. The package of claim 8 wherein the first die is oriented such that the active surface of the first die faces away from the first side die attach region.

10. The package of claim 9 wherein the first die is electrically interconnected to the lead.

11. The package of claim 8 wherein the second die is oriented such that the active surface of the second die faces the die mount surface of the cavity.

12. The package of claim 11 wherein the second die is electrically interconnected to the lead frame by wire bonds.

13. The package of claim 11 wherein the second die is positioned such that the die pads underlie the gap, and the wire bonds pass through the gap.

14. The package of claim 11 wherein the second die is electrically interconnected to the lead frame by flip chip interconnection.

15. The package of claim 8, further comprising an additional die stacked over the first die.

16. The package of claim 8, further comprising an encapsulant covering the die and the interconnections.

17. The package of claim 16, wherein a surface of the second side of the leadframe is left uncovered by the encapsulant.

18. The package of claim 16, wherein a surface of lands on the second side of the die paddle is left uncovered by the encapsulant.

19. A multi-package module comprising at least a first multichip leadframe semiconductor package according to claim 8, stacked with at least one second package, the packages having electrical interconnections between second-level interconnect sites on the first multichip leadframe semiconductor package and second-level interconnect sites on the second package.

20. The multi-package module of claim 19 wherein the electrical interconnections comprise wire bonds.

21. The multi-package module of claim 19 wherein the electrical interconnections comprise solder balls.

22. The multi-package module of claim 19 wherein the at least one second package is a second multichip leadframe semiconductor package according to claim 8.

* * * * *

UNITED STATES PATENT AND TRADEMARK OFFICE
CERTIFICATE OF CORRECTION

| | | |
|---|---|---|
| PATENT NO. | : 7,436,048 B2 | Page 1 of 1 |
| APPLICATION NO. | : 11/686010 | |
| DATED | : October 14, 2008 | |
| INVENTOR(S) | : Ha et al. | |

It is certified that error appears in the above-identified patent and that said Letters Patent is hereby corrected as shown below:

<u>Column 7</u> line 41, delete "20" and insert therefor --20 micrometers-- line 42, delete "100" and insert therefor --100 micrometers-- line 43, delete "50" and insert therefor --50 micrometers-- line 44, delete "150" and insert therefor --150 micrometers-- line 50, delete "300 (12)" and insert therefor --300 micrometers (12 mil)--

Signed and Sealed this

Ninth Day of December, 2008

JON W. DUDAS
*Director of the United States Patent and Trademark Office*

UNITED STATES PATENT AND TRADEMARK OFFICE
CERTIFICATE OF CORRECTION

PATENT NO.         : 7,436,048 B2                                                Page 1 of 1
APPLICATION NO.    : 11/686010
DATED              : October 14, 2008
INVENTOR(S)        : Ha et al.

It is certified that error appears in the above-identified patent and that said Letters Patent is hereby corrected as shown below:

Column 12:
      Claim 10, line 18, delete "lead." and insert therefor --lead frame by wire bonds.--

Signed and Sealed this

Seventh Day of December, 2010

David J. Kappos
*Director of the United States Patent and Trademark Office*